(12) United States Patent
Abe

(10) Patent No.: US 9,938,636 B2
(45) Date of Patent: Apr. 10, 2018

(54) SINGLE CRYSTAL PRODUCTION APPARATUS

(71) Applicant: TOYOTA JIDOSHA KABUSHIKI KAISHA, Toyota-shi, Aichi-ken (JP)

(72) Inventor: Nobuhira Abe, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 77 days.

(21) Appl. No.: 15/001,830

(22) Filed: Jan. 20, 2016

(65) Prior Publication Data

US 2016/0208407 A1 Jul. 21, 2016

(30) Foreign Application Priority Data

Jan. 20, 2015 (JP) ................ 2015-008728

(51) Int. Cl.
| | | |
|---|---|---|
| C30B 35/00 | (2006.01) | |
| C30B 15/14 | (2006.01) | |
| C30B 15/30 | (2006.01) | |
| C30B 29/36 | (2006.01) | |
| C30B 31/12 | (2006.01) | |
| C30B 25/10 | (2006.01) | |

(52) U.S. Cl.
CPC ............ *C30B 15/14* (2013.01); *C30B 15/305* (2013.01); *C30B 29/36* (2013.01); *C30B 35/00* (2013.01); *C30B 25/10* (2013.01); *C30B 31/12* (2013.01)

(58) Field of Classification Search
CPC .......... C30B 25/10; C30B 31/12; C30B 35/00
See application file for complete search history.

(56) References Cited

U.S. PATENT DOCUMENTS

| 3,311,494 | A | * | 3/1967 | Reinert | ................ | B05D 5/083 |
| | | | | | | 427/379 |
| 3,983,051 | A | * | 9/1976 | Cline | ................. | C30B 11/10 |
| | | | | | | 252/301.4 R |
| 4,659,601 | A | * | 4/1987 | Elliott | ................. | F16L 59/07 |
| | | | | | | 138/148 |
| 4,823,735 | A | * | 4/1989 | Pichel | ................. | C30B 25/105 |
| | | | | | | 118/620 |
| 4,858,557 | A | * | 8/1989 | Pozzetti | ............. | C23C 16/4411 |
| | | | | | | 118/725 |
| 5,444,217 | A | * | 8/1995 | Moore | ............... | C23C 16/4404 |
| | | | | | | 219/405 |

FOREIGN PATENT DOCUMENTS

| JP | S63-50391 A | 3/1988 |
| JP | S63-284810 A | 11/1988 |
| JP | 2014-069991 A | 4/2014 |

* cited by examiner

*Primary Examiner* — Matthew Song
(74) *Attorney, Agent, or Firm* — Oliff PLC

(57) ABSTRACT

A single crystal production apparatus wherein the chamber has a top plate part, a bottom plate part and a barrel part, the barrel part is in a hollow cylindrical shape and made of quartz glass and connects the top plate part with the bottom plate part, an openable/closable reflective member is provided on the outer circumference of the barrel part, and the reflective member is divided in the circumferential direction and reflects heat and light radiated from the inside of the chamber.

2 Claims, 3 Drawing Sheets

SINGLE CRYSTAL PRODUCTION APPARATUS

TECHNICAL FIELD

The present invention relates to a single crystal production apparatus. More specifically, the present invention relates to an apparatus for producing a SiC single crystal by a solution method.

BACKGROUND ART

As an apparatus for producing a single crystal, there is an apparatus in which a seed crystal is dipped in a raw material solution in a crucible disposed inside a chamber and pulled up.

Patent Document 1 discloses an apparatus for producing a Si (silicon) single crystal by the Czochralski method, where a heating means is disposed on the outer circumference of a crucible, a thermal insulator is disposed on the outer circumference thereof, and a cooling jacket is disposed on the further outer circumference thereof. In the cooling jacket, a gas for cooling is flowed.

In the production apparatus disclosed in Patent Document 1, a seed crystal dipped in a Si solution in the crucible is pulled up to produce a Si single crystal. An observation window for confirming the state of the Si single crystal during pulling up or the Si solution in the crucible is disposed on the top surface of the cooling jacket housing.

RELATED ART

Patent Document

[Patent Document 1] Japanese Unexamined Patent Publication No. S63-50391

SUMMARY OF THE INVENTION

Problems to be Solved by the Invention

As an apparatus for producing a SiC (silicon carbide) single crystal, an apparatus using a solution method is known. In the solution method, raw material Si (silicon) is charged into a graphite crucible provided inside a chamber, and the raw material Si is melted by a heating coil to form a Si solution. C is dissolved out from the graphite crucible into this Si solution to form a Si—C solution, and a seed crystal dipped in the Si—C solution is pulled up, whereby a SiC single crystal is produced.

In the case of a solution method, C needs to be dissolved out from the graphite crucible into the Si solution to form an Si—C solution and at the same time, in the vicinity of the liquid level of the Si—C solution, the temperature of the Si—C solution must be higher than the temperature of a Si solution in the Czochralski method.

The temperature of a Si—C solution is very high, and therefore even when a cooling jacket is provided in a chamber, the cooling capacity thereof is insufficient. Therefore, in order to reduce the radiant heat from a heat source such as crucible, the inner surface of the chamber is kept away from the heat source, leading to an increase in the size of the chamber.

In addition, when the barrel part of the chamber is made of metal, in the case where the heating means disposed on the outer circumference of a crucible is an induction heating coil, an eddy current may also be generated in the barrel part of the chamber, and a preventive measure thereof is required as well.

Furthermore, since a cooling jacket is complicatedly arranged in the barrel part of the chamber, an observation window for confirming the inside of the chamber is often disposed only on a top plate part, and therefore the entire region inside the chamber cannot be observed.

An object of the present invention is to provide a single crystal production apparatus capable of solving the above-described problems.

Means to Solve the Problems

The gist of the present invention is as follows.

<1> A single crystal production apparatus, comprising a chamber housing a crucible and an induction heating coil, wherein said chamber has a top plate part, a bottom plate part, and a barrel part, said barrel part has a hollow cylindrical shape and is made of quartz glass, and connects said top plate part with said bottom plate part, an openable/closable reflective member is provided on the outer circumference of said barrel part, and the reflective member is divided in the circumferential direction and reflects heat and light radiated from the inside of the chamber.

<2> The apparatus according to <1>, wherein said reflective member is a plurality of electromagnetic steel sheets stacked from the outer circumference toward the inner circumference.

Effects of the Invention

According to the present invention, the barrel part of the chamber is made of quartz glass, whereby the inner side surface of the barrel part need not be kept away from a heat source and size reduction of the single crystal production apparatus can be achieved, and at the same time, the reflective member provided on the outer circumference of the barrel part reflects heat and light (infrared ray) radiated from the inside of the chamber, so that a single crystal production apparatus capable of efficiently heating a raw material can be provided. Furthermore, the barrel part is made of quartz glass and the reflective plate is designed to be openable/closable, and thus with regard to a single crystal production apparatus it is possible to observe the entire region inside the chamber during the production of a single crystal can be provided.

MODE FOR CARRYING OUT THE INVENTION

Figure 1:
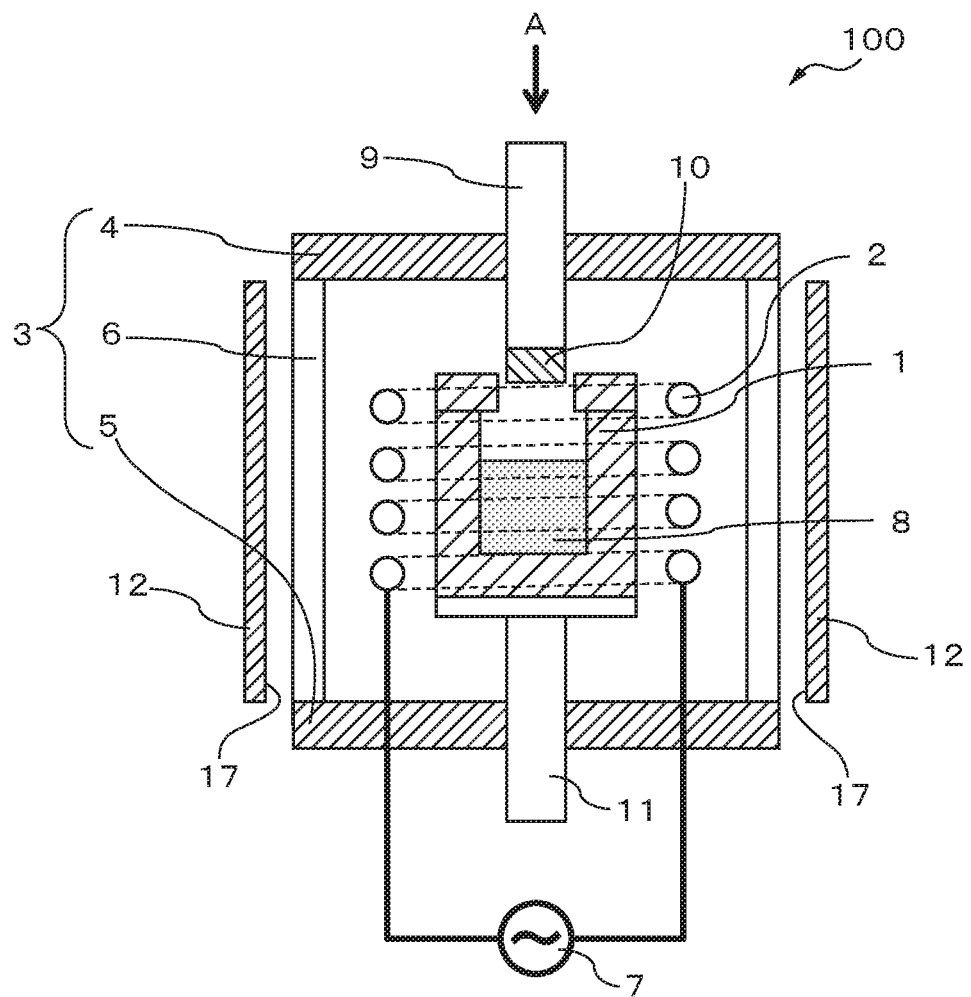
[FIG. 1] A view illustrating an example of the outline of the single crystal production apparatus according to the present invention.

The embodiment of the single crystal production apparatus according to the present invention is described below by referring to the drawings. The present invention is not limited to the following embodiment. For example, as described above, the present invention is particularly suitably used as a SiC single crystal production apparatus where the temperature of a solution in a crucible is very high, but the present invention may also be used as a Si single crystal production apparatus where the temperature of a solution in a crucible is not so high.

FIG. 1 is a view illustrating an example of the outline of the single crystal production apparatus according to the present invention.

In the single crystal production apparatus 100 of the present invention, a crucible 1 and an induction heating coil 2 are housed in a chamber 3.

The chamber 3 comprises a top plate part 4, a bottom plate part 5, and a barrel part 6. The barrel part 6 constitutes the chamber 3 by connecting the top plate part 1 with the bottom plate part 5. The top plate part 1 and the bottom plate part 5 are not particularly limited in the material but in general are metal-made. The barrel part 6 has a hollow cylindrical shape and made of quartz glass. The reason therefor and the action and effect thereof are described later.

The induction heating coil 2 is disposed on the periphery of the crucible 1. The induction heating coil 2 is connected to a high-frequency power source 7. A high-frequency current is flowed to the induction heating coil 2, whereby a raw material (not illustrated) charged into the crucible 1 is melted to form a raw material solution 8.

The raw material solution 8 is not particularly limited, but the present invention is effective particularly when the temperature of the raw material solution 8 must be made very high as in the case of producing a SiC single crystal.

A seed crystal 10 connected with a seed crystal holder 9 is dipped in the raw material solution 8 and pulled up. At the time of pulling up, the seed crystal holder 9 may be rotated. Alternatively, the crucible 1 may be rotated by connecting a rotary shaft 11 to the bottom of the crucible 1.

As described above, the barrel part 6 has a hollow circular cylindrical shape and is made of quartz glass. In the embodiment illustrated in FIG. 1, the barrel part 6 has a hollow circular cylindrical shape, but the present invention is not limited thereto, and the shape may be sufficient if it is hollow and cylindrical. For example, the shape may be a hollow elliptic cylindrical shape or a hollow rectangular cylindrical shape.

The quartz glass as high in heat resistance compared with a metal material, and therefore the inner side surface of the barrel part 6 need not be kept away from the crucible 1, the induction heating coil 2 and the raw material solution 8, which are heat sources. Consequently, the diameter of the barrel part 6 need not be made larger, and size reduction of the chamber 3 can be achieved. Above all, in the case of producing a SiC single crystal, the barrel part 6 is exposed to a large quantity of radiant heat, because the temperature of a Si—C solution in the crucible 1 is made very high, and the advantage of the use of the quartz glass-made barrel part 6 is particularly great.

In general, the production of a single crystal takes much time, and a large number of single crystal production apparatuses are required. Accordingly, size reduction of the chamber 3 has a great advantage that a large number of single crystal production apparatuses can be disposed in a space having the same size.

In addition, since the barrel part 6 is made of quartz glass, the entire region inside the chamber 3 can be observed. Particularly in the case of rotating the crucible 1, whether an abnormality is generated in the crucible 1 or not can be observed, and the configuration above is particularly effective.

If the barrel part 6 is made of a metal material, when a high-frequency current is flowed to the induction heating coil 2, an eddy current is generated in the barrel part 6, giving rise to heating of the barrel part 6. However, the barrel part 6 is made of quartz glass, and generation of an eddy current is thereby eliminated.

On the other hand, since the barrel part 6 is made of quartz glass, heat and light (infrared ray) radiated from the crucible 1, etc. is released outside of the chamber 3.

To cope with this, in the present invention, as illustrated in FIG. 1, a reflective member 12 is provided on the outer circumference of the barrel part 6 to cover the entire outer circumference of the barrel part 6.

Figure 2:
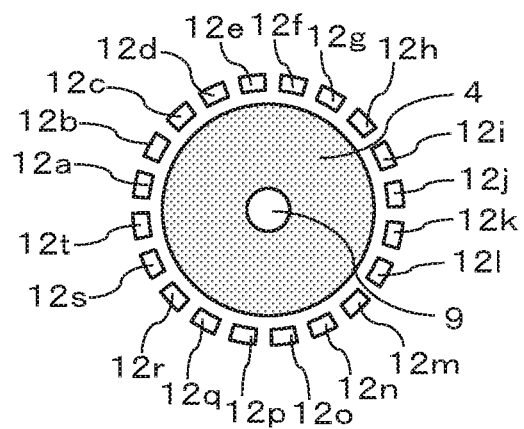
[FIG. 2] A view of the single crystal production apparatus of the present invention viewed from the A direction in FIG. 1

FIG. 2 is a view of the single crystal production apparatus of the present invention viewed from the A direction in FIG. 1

The reflective member 12 is divided into 20 parts in the circumferential direction and provided as reflective members 12a to 12t on the outer circumference of the barrel part 6.

When the reflective member 12 has a hollow cylindrical shape, a large amount of eddy current is generated in the reflective member 12, and the reflective member 12 is heated, but the reflective member 12 is thus divided, so that the generation of an eddy current in the reflective member 12 can be minimized. Incidentally, when the barrel part 6 has a hollow rectangular cylindrical shape, the reflective member 12 is also provided to follow the outer circumferential shape of the barrel part 6, and the effect of the above-described division is the same.

Figure 3:
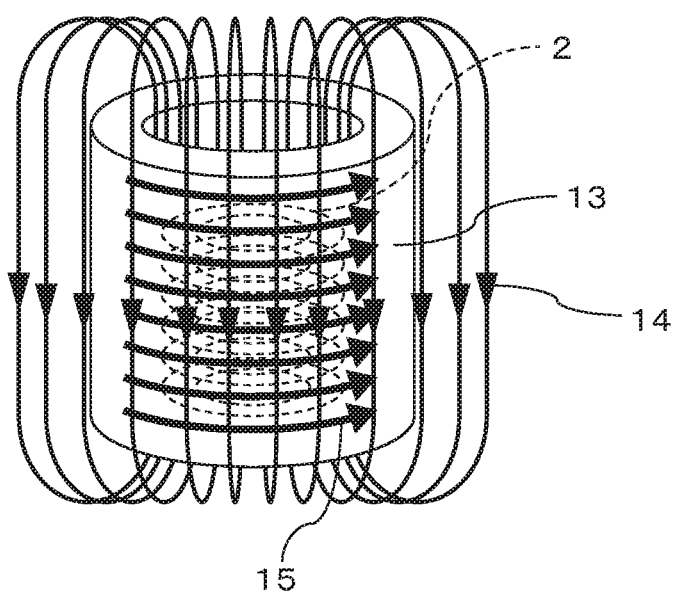
[FIG. 3] A view illustrating a magnetic flux acting on a hollow cylindrical member disposed on the outer circumference of an induction heating coil and an eddy current generated by the magnetic flux.
Figure 4:
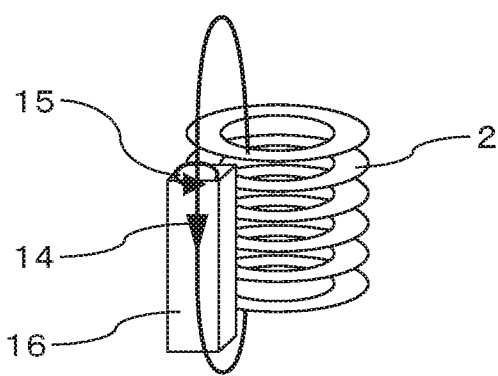
[FIG. 4] A view illustrating a magnetic flux acting on a plate-like member disposed on the outer circumference of an induction heating coil and paralleled to the axial direction of the induction heating coil.

FIG. 3 is a view illustrating a magnetic flux acting on a hollow cylindrical member disposed on the outer circumference of an induction heating coil and an eddy current generated by the magnetic flux. FIG. 4 is a view illustrating a magnetic flux acting on a plate-like member disposed on the outer circumference of an induction heating coil and paralleled to the axial direction of the induction heating coil.

As illustrated in FIG. 3, when a hollow cylindrical member 13 is disposed on the outer circumference of the induction heating coil 2, the number of magnetic fluxes 14 traversing the hollow cylindrical member 13 is large, and a large amount of eddy current 15 is generated. On the other hand, as illustrated in FIG. 4, the number of magnetic fluxes 14 traversing the plate-like member 16 disposed on the outer circumference of the induction heating coil 2 and paralleled to the axial direction of the induction heating coil 2 is small, and generation of an eddy current 15 is also minimum.

For this reason, the reflective member 12 is divided as in the embodiment illustrated in FIG. 2. In the embodiment illustrated in FIG. 2, the total circumference of the reflective members 12a to 12t is divided into 20 parts of reflective members 12a to 12t, but the present invention is not limited thereto. The number of partitions is ideally large as illustrated in FIG. 4, but as long as the amount of eddy current generated is suppressed to an extent causing no trouble in practice even with a small number of partitions, that number of partitions may be employed.

In each of the reflective members 12a to 12t, a plurality of thin steel sheets are preferably stacked from the outer circumference toward the inner circumference. More specifically, in each of the reflective members 12a to 12t, a plurality of thin steel sheets are preferably stacked in the radial direction of a circle defined by all of the reflective members 12a to 12t. Due to the above-described division in the circumferential direction, generation of an eddy current can be suppressed. In addition, when each of the reflective members 12a to 12t is divided also in the radial direction, the generation of eddy current can be further suppressed, because an eddy current occurs on the surface of a solid body.

Heat and light (infrared ray) radiated from the inside of the chamber 3 are reflected by the reflective members 12a to 12t. The heat and light (infrared ray) are derived from the crucible 1, the induction heating coil 2, and the raw material melt 8.

In order to efficiently reflect the heat and light, the inner circumference 17 of each of the reflective members 12a to 12t is preferably subjected to bright plating or mirror processing by electroplating, etc. In the case where thin steel sheets are stacked in each of the reflective members 12a to 12t, the inner circumferential side of the sheet steel sheet positioned at the innermost circumference is preferably subjected to bright plating or mirror processing. In the case where electromagnetic steel sheets are stacked in each of the reflective members 12a to 12t, a thin steel sheet subjected to mirror processing is preferably used only on the innermost circumference.

Figure 5:
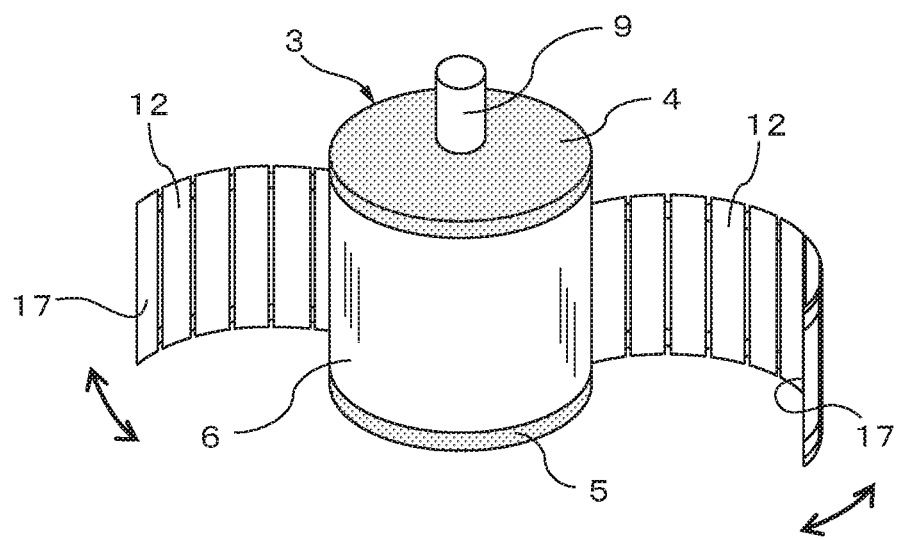
[FIG. 5] A perspective view of the single crystal production apparatus according to the present invention when a reflective member is opened.

FIG. 5 is a perspective view of the single crystal production apparatus according to the present invention when the reflective member 12 is opened.

The reflective member 12 can be opened and closed as illustrated in FIG. 5. The method for attachment in such an openable/closable manner includes, but is not limited to, a method of connecting the single crystal production apparatus 100 with the reflective member 12 by a hinge.

Due to the structure above of the reflective member 12, the reflective member 12 is opened when observing the inside of the chamber 3, and the refractive member 12 is otherwise closed to reflect the heat and light radiated from the inside of the chamber 3 toward the outside of the chamber 3 and at the same time, prevent the heat and light from leaking outside the chamber 3.

As described in the foregoing pages, a function of sealing the inside of the chamber 3, allowing placement of the inner circumference of the barrel part 6 in proximity to the heat source such as crucible 1, and enabling observation of the entire region inside the chamber 3 is imparted to the quartz glass-made barrel part 6, whereas a function of causing heat and light (infrared) from the inside of the chamber 3 to be reflected toward the inside of the chamber 3 and be blocked from leaking outside the chamber 3 is imparted to the reflective member 12. Therefore, respective functions are divided between the quartz glass-made barrel part 6 and the reflective member 12, as a result, it is possible to reduce the size of the single crystal production apparatus 100 and observe the entire region inside the chamber 3 during the production of a single crystal.

INDUSTRIAL APPLICABILITY

According to the present invention, the single crystal production apparatus can be downsized and at the same time, the entire region inside the chamber can be observed during the production of a single crystal. Hence, there is great industrial applicability in the present invention.

DESCRIPTION OF NUMERICAL REFERENCES

1 Crucible
2 Induction heating coil
3 Chamber
4 Top plate part
5 Bottom plate part
6 Barrel part
7 High-frequency power source
8 Raw material solution
9 Seed crystal holder
10 Seed crystal
11 Rotary shaft
12, 12a-12t Reflective member
13 Hollow cylindrical member
14 Magnetic flux
15 Eddy current
16 Plate-like member
17 Inner circumference
100 Single crystal production apparatus

The invention claimed is:

1. A single crystal production apparatus, comprising a chamber housing a crucible and an induction heating coil, wherein
said chamber has a top plate part, a bottom plate part, and a barrel part,
said barrel part has a hollow cylindrical shape and is made of quartz glass, and connects said top plate part with said bottom plate part,
an openable/closable reflective member is provided around an outer circumference of said barrel part,
said reflective member is divided into a plurality of parts in a circumferential direction and reflects heat and light radiated from the inside of said chamber, and
each one of the plurality of parts of the reflective member is comprised of a plurality of electromagnetic steel sheets stacked in a radial direction from an outer circumference toward an inner circumference.

2. The single crystal production apparatus of claim 1, wherein the inner circumference side of the plurality of stacked electromagnetic steel sheets is subjected to bright plating or mirror polishing.